VARIABLE FREQUENCY OSCILLATION GENERATORS

Filed March 8, 1965

3 Sheets-Sheet 1

| FILTER | PASS FREQUENCY |
|---|---|
| 91 | 11·0 mc/s |
| 92 | 11·1 " |
| 93 | 11·2 " |
| 94 | 11·3 " |
| 95 | 11·4 " |
| 96 | 11·5 " |
| 97 | 11·6 " |
| 98 | 11·7 " |
| 99 | 11·8 " |
| 100 | 11·9 " |

United States Patent Office 3,312,909
Patented Apr. 4, 1967

3,312,909
VARIABLE FREQUENCY OSCILLATION GENERATORS

Allan Victor Bryant, Stubbington, near Fareham, England, assignor to Communications Patents Limited, London, England Filed Mar. 8, 1965, Ser. No. 437,732
Claims priority, application Great Britain, Mar. 26, 1964, 12,848/64
4 Claims. (Cl. 331—60)

This invention relates to variable frequency oscillation generators and in particular to apparatus, forming a part of such generators, for providing a plurality of frequency stabilised electric oscillations by which the frequency tolerance of a selected output oscillation of the generator is determined.

It is usually required that the frequency of the output oscillation provided by an oscillation generator should have a stability of the order of 1 part in $10^5$ or better. Further, for convenience of operation, it is usually required that any desired frequency can be set up on a decimal or decade basis using, for example, two or more multi-position controls.

A number of arrangements have already been proposed to meet these requirements. In these arrangements, the selected output frequency is derived from, or is automatically controlled with reference to, two or more oscillation waves, the frequencies of which are variable and are stabilised to an acuracy at least equal to that desired for any frequency setting of the generator.

Such arrangements have complex circuits, often incorporating several frequency stabilised oscillator stages. Hitherto, difficulty has been experienced in incorporating arrangements of this kind in equipment where space is limited and where a large number of operating frequencies have to be provided, for example, in portable radio transmitting and receiving equipment providing several thousands of operating channels with 1000 c.p.s. adjacent channel spacing.

Variable frequency oscillation generators for providing any desired frequency within a relatively large range of frequencies, with a predetermined toleratnce, can be of two main types:

(a) Those in which an output of the desired frequency is obtained by mixing a plurality of frequency stabilised oscillations, and (b) Those in which an output oscillation of the desired frequency is derived from a variable frequency oscillator, the oscillator being controlled by a reactance device so that the output oscillation is phase-locked to a plurality of frequency stabilised reference oscillations.

In both types of oscillation generator, a plurality of separate frequency stabilised oscillations has to be provided, each oscillation having one of a number of predetermined frequencies.

It is a general object of the present invention to provide improved variable frequency oscillation generators and a more particular object to provide improved means for providing a plurality of frequency stabilised oscillations, for such variable frequency oscillation generators, whereby the cost, complexity and size of such generators is reduced.

According to the present invention, apparatus for providing at least two frequency stabilised oscillations comprises a source of oscillation harmonics of stable frequency, a plurality of electric wave filters adapted each to pass a different one of the said harmonics, switching means for selecting at least two of the harmonic oscillations passed by the electric wave filters, at least two output terminals supplied with oscillation selected by the switching means, at least one of the output terminals being so supplied by way of a frequency divider, the ratio of frequency division of said frequency divider being greater than the frequency ratio between the highest and lowest of the harmonic oscillations passed by the electric wave filters.

In order that the invention may be readily carried into effect, several embodiments thereof will now be described in detail, by way of example, with reference to the accompanying drawings, in which.

Figure 1:
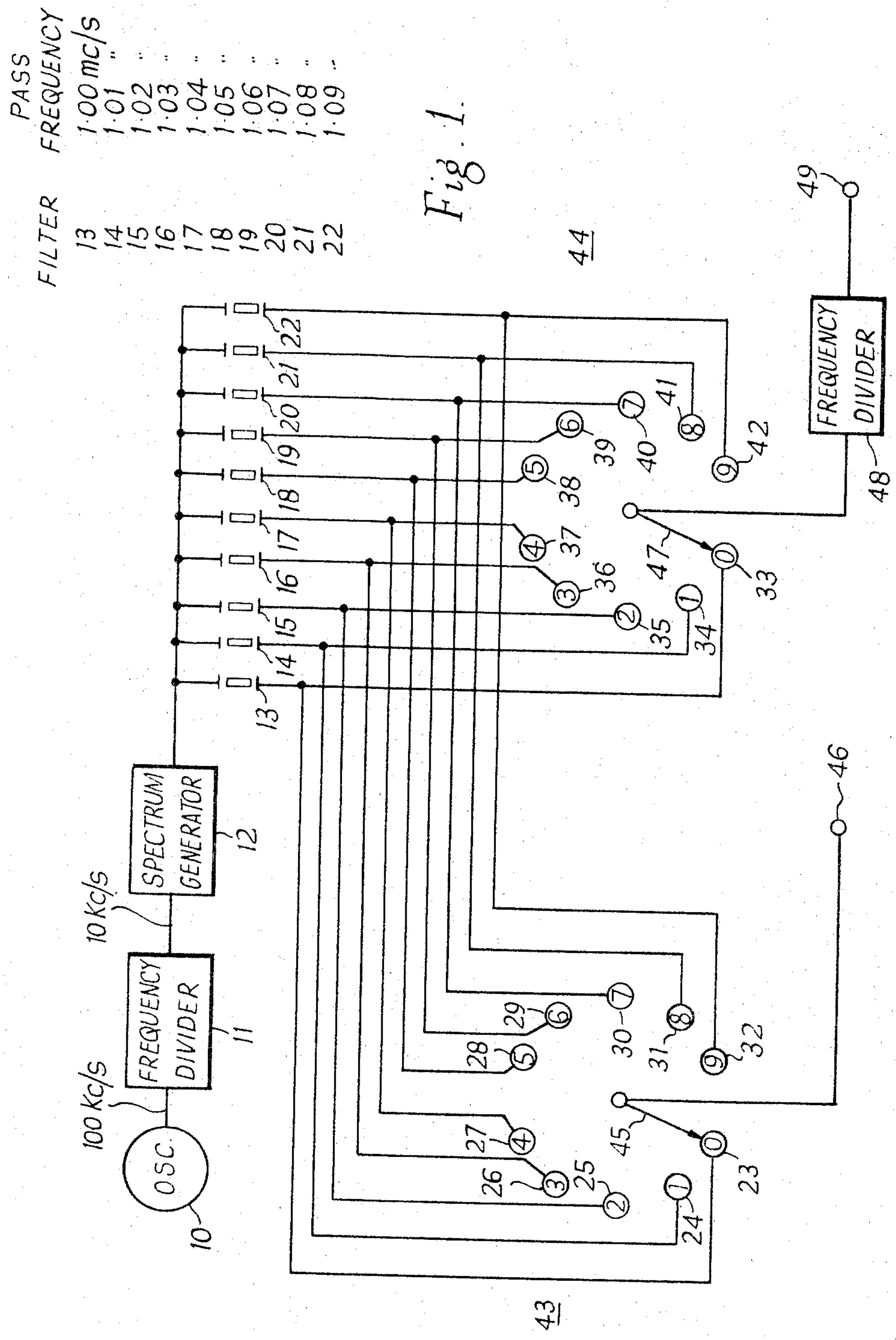
FIG. 1 is a block schematic diagram of an arrangement for providing two separate frequency stabilised oscillations, the frequency of each oscillation being variable in steps.

An arrangement is shown in FIG. 1, for providing from a common source of a plurality of frequency stabilised harmonically related oscillations, two separate oscillations each variable in frequency in steps, the frequency steps of the two oscillations having a 10:1 relationship between them.

Referring to FIG. 1, the output of a crystal controlled oscillator 10 is fed to a first frequency divider 11. In the frequency divider 11, pulses are generated having a repetition frequency which is a constant fraction of the frequency of the oscillator 10. The output pulses produced by the frequency divider 11 are fed to the input of a spectrum generator 12 which includes amplifying means.

The spectrum generator 12 is of conventional design and is essentialy an oscillator controlled by the pulses of the first frequency divider 11. The modulated pulses produced by the spectrum generator have a repetition frequency which is a constant fraction of the frequency of the oscillator 10, hence a train of harmonics is produced which are phase locked to the driving pulses provided by the frequency divider. An example of such a spectrum generator is described in detail in an article due to Alwin Hahnel, entitled "Multichannel crystal Control of VHF and UHF Oscillators," published in the "Proceedings of the I.R.E.," vol. 41 (1953) pages 79–81.

The output of the spectrum generator is fed to a bank of ten preset filters 13 to 22, each of which is tuned to a different one of ten consecutive harmonics produced by the spectrum generator. The outputs of the filters 13 to 22 are respectively connected to contacts 23 to 32 of a multi-position switch 43 and to contacts 33 to 42 of a multi-position switch 44. The switch 43 has a contact arm 45, connected to an output terminal 46, to which is fed the harmonic selected according to the position of the switch arm 45 to provide a first output oscillation. The switch 44 has a contact arm 47 which is connected to a second frequency divider 48 in which an output oscillation is produced whose frequency is one tenth of the frequency of the harmonic selected according to the position of the switch arm 47. The output of the frequency divider 48 is fed to an output terminal 49 to provide a second output oscillation.

The frequency dividers 11 and 48 are of a type using feedback in cascaded scale-of-two circuits to obtain a scale-of-ten. Such circuits are described in detail in "Waveforms" in the Radiation Laboratory Series, of the Massachusetts Institute of Technology, vol. 19, Sec. 17.3. Other forms of frequency dividers of conventional design may be employed, if desired, examples of which are given in chapters 15, 16 and 17 of "Waveforms."

In the example of FIG. 1, the oscillator 10 is crystal controlled at a frequency of 100 kc./s., so that the output of the decade frequency divider 11 is a wave of frequency 10 kc./s. The output of the spectrum generator 12 is thus a series of harmonically related waves, consecutive ones of which differ in frequency by 10 kc./s.

Where space is an important consideration, crystal type filters are used, each of the filters being tuned to pass a different one of the harmonics in the frequency range it is desired to cover. For example, the filters 13 to 22 are tuned to a respective one of ten 10 kc./s. harmonics in the frequency range 1.00 mc./s. to 1.09 mc./s., so that the output oscillations from terminal 46 may be varied in frequency in 10 kc./s. steps and the output oscillations from terminal 49 may be varied in frequency in 1 kc./s. steps, in two decades. Hence an oscillation variable in frequency in 1 kc./s. steps in the range 1.10 mc./s. to 1.199 mc./s. is provided when the two output oscillations are combined. An example of a crystal filter of preferred form is described in "Electronic and Radio Engineering," F. E. Terman, 4th edition, pages 955–956.

In the example of FIG. 1, the harmonic frequencies are chosen so that the output oscillations, when combined, have one frequency value which contains an integral number of 100 kc./s. harmonics. A series of harmonic frequencies located in any part of a desired frequency band may be used, if suitable switching arrangements are provided.

Figure 2:
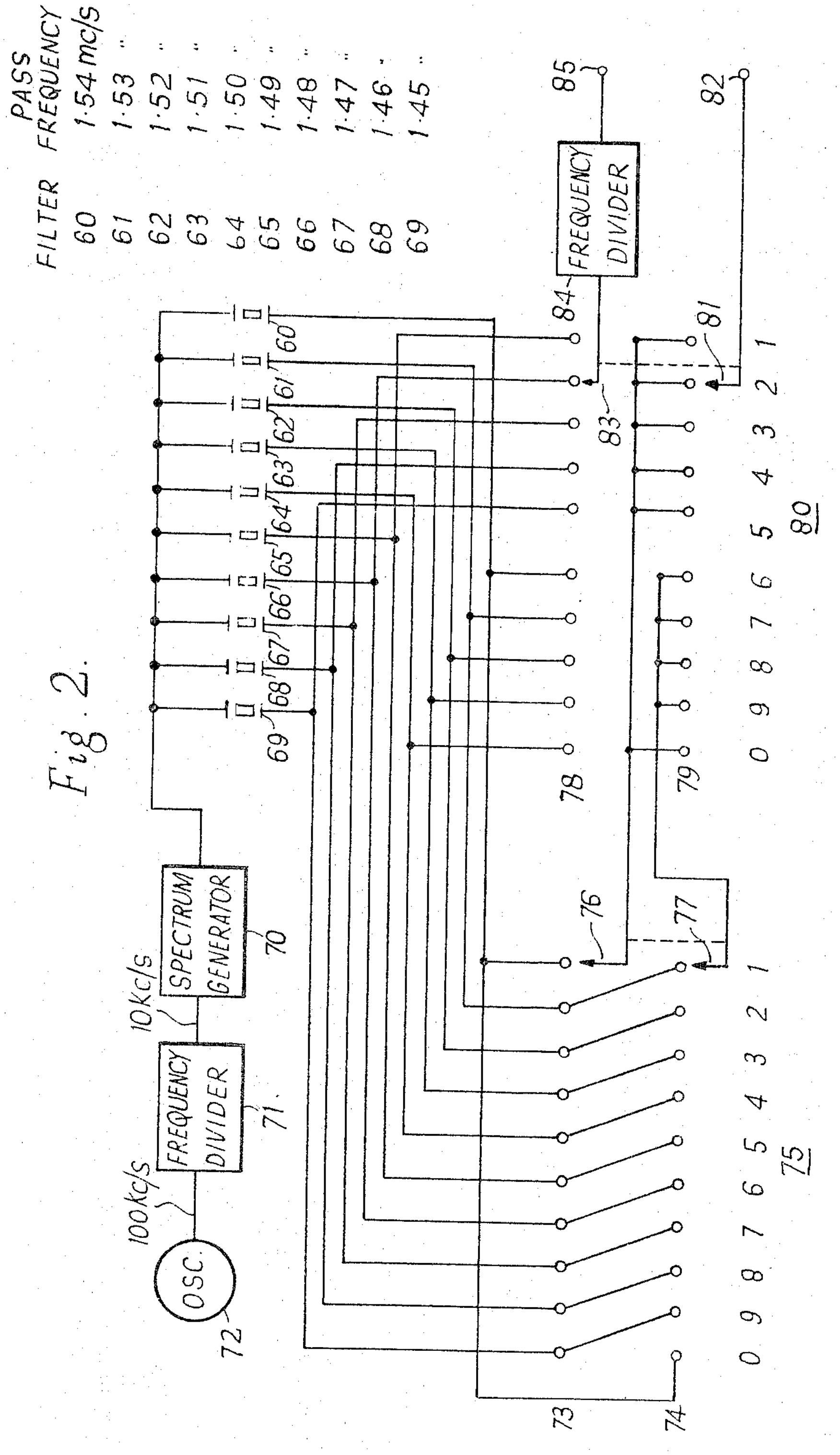
FIG. 2 is a block schematic diagram of an alternative form of the arrangement of FIG. 1.

One example of a switching arrangement suitable for use with ten consecutive 10 kc./s. harmonics in the frequency range 1.45 mc./s. to 1.54 mc./s. is shown in FIG. 2.

Referring to FIG. 2, a bank of ten crystal filters 60 to 69, each of which is tuned to a different one of the ten harmonic frequencies, is fed with a spectrum of harmonics provided by a harmonic generator 70. The harmonic generator 70 is supplied with pulses generated in a frequency divider 71, to which oscillations are fed from a frequency stabilised oscillator 72.

The outputs of the filters 60 to 69 are fed to two banks of ten contacts 73 and 74 of a multi-position switch 75. The filters 60 to 69 are connected to contacts corresponding to switch positions 1 to 9 and 0, respectively, of the bank of contacts 73, and the filters 60 to 69 are also connected to contacts corresponding to switch positions 0 and 1 to 9, respectively, of the bank of contacts 74.

The outputs of the filters are also fed to one of two banks of contacts 78 and 79 of a multi-position switch 80, the filters 60 to 64 being connected to contacts corresponding to switch positions 6 to 9 and 0, respectively, of the bank of contacts 78, and the filters 65 to 69 being connected to contacts corresponding to switch positions 1 to 5, respectively, of the bank of contacts 78.

The contacts corresponding to switch positions 0, and 1 to 5 of the bank of contacts 79 are connected together and to a contact arm 76 associated with the bank of contacts 73 of the switch 75. The contacts corresponding to switch positions 6 to 9 of the bank of contacts 79 are connected together and to a contact arm 77 associated with the bank of contacts 74 of the switch 75.

A contact arm 81, associated with the bank of contacts 79 of the switch 80, is connected to an output terminal 82 to provide a first output oscillation. A contact arm 83, associated with the bank of contacts 78 of the switch 80, is connected to the input of a frequency divider 84. In the frequency divider 84, an oscillation is produced whose frequency is one tenth of the harmonic frequency selected according to the position of the contact arm 83. The output of the frequency divider 84 is fed to an output terminal 85 to provide a second output oscillation.

In the example of FIG. 2, the oscillator 72 provides a wave of frequency 100 kc./s., the frequency divider 71 a wave of frequency 10 kc./s. and the spectrum generator 70 a spectrum of harmonically related waves spaced apart in frequency by 10 kc./s.

The filters 60 to 69 are tuned to pass ten harmonics spaced apart by 10 kc./s. from 1.45 mc./s. to 1.54 mc./s. as shown in the table appended to FIG. 2.

Using simple switching in two decades of the kind shown in FIG. 1, an oscillation variable in 1 kc./s. steps in the range 1.595 mc./s. to 1.694 mc./s. would be provided by combining the two outputs.

The arrangement shown in FIG. 2 is suitable for use in equipment in which it is required to cover a frequency range greater than that provided by varying the frequency in steps in two decades. For example, the first and second output oscillations may be used in conjunction with a selected one of a series of 100 kc./s. harmonics, to provide three oscillations, variable in frequency in 1 kc./s., 10 kc./s. and 100 kc./s. steps in three decades, whereby any one of 1000 controlled frequencies may be obtained.

In the arrangement of FIG. 2, the sum of the frequencies of the oscillations provided at the output terminals 82 and 85 when the contact arms of the switches 75 and 80 are at the zero settings, have a value which contains an integral number of 100 kc./s. harmonics. This is desirable since the 1 kc./s. and 10 kc./s. digits in the numerical value of the frequency are then zero and the need to provide frequency corrections for this purpose, in any mixing devices associated with the 1 kc./s. and 10 kc./s. decades, is avoided.

The connections to the contacts of the switches 75 and 80 are such that the sum of the frequencies of the first and second output oscillations increases in 1 kc./s. steps from 1.601 mc./s. to 1.69 mc./s. for settings from 9 and 9 of the switches 75 and 80, respectively, to settings 1 and 0 of the switches 75 and 80, respectively.

With the switch 75 set to the 0 position, the frequencies 1.691, 1.692, 1.693 and 1.694 are respectively provided for settings 9, 8, 7, and 6 of the switch 80 and the frequencies 1.595, 1.596, 1.597, 1.598, 1.599 and 1.6 are respectively provided for settings 5, 4, 3, 2, 1, and 0 of the switch 80. Where the arrangement of FIG. 2 is part of apparatus used for control purposes, the circuits of the apparatus can be so designed that adjacent 100 kc./s. harmonics are used, so that the 100 kc./s. difference between the two groups of frequencies is of no consequence.

An arrangement for providing three separate oscillations, each variable in frequency in steps, using a single bank of filters, will now be described.

Figure 3:
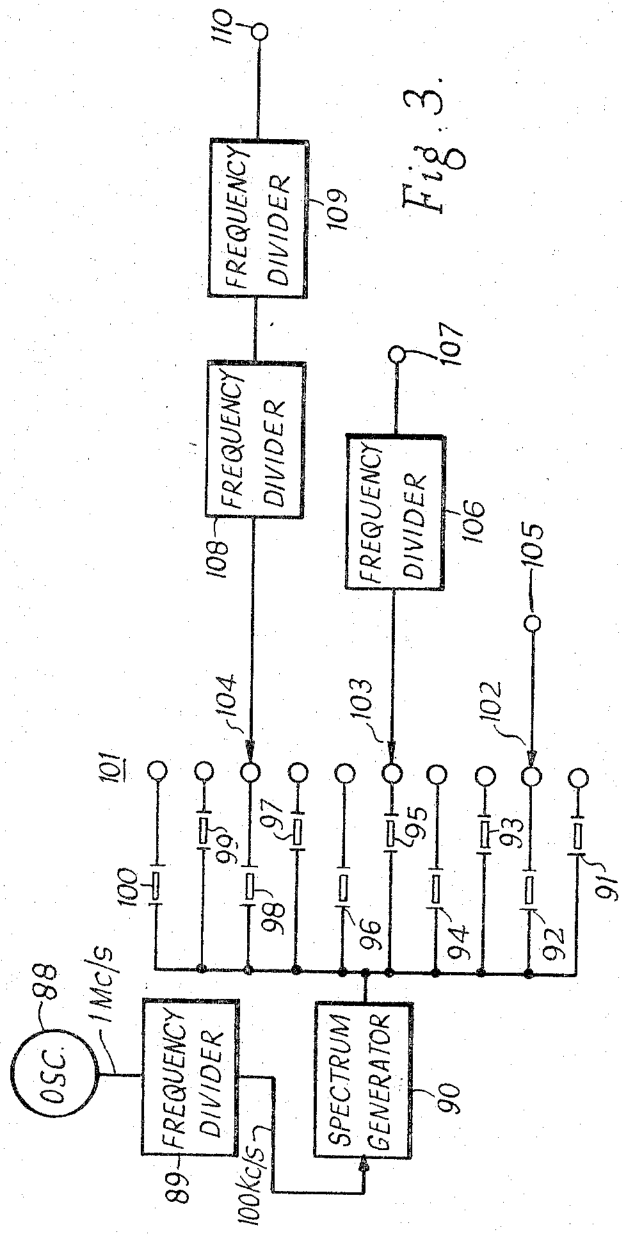
FIG. 3 is a block schematic diagram of an arrangement for providing three separate frequency stabilised oscillations, the frequency of each oscillation being variable in steps.

Referring to FIG. 3, a spectrum generator 90 is preceded by a frequency divider 89 fed from a crystal controlled oscilltaor 88, as in the arrangements of FIGS. 1 and 2.

Harmonics provided by the spectrum generator 90 are fed to a group of ten preset filters 91 to 100, each of which is tuned to pass a different one of ten consecutive harmonics produced by the spectrum generator. The spectrum generator 90 is fed with input pulses derived from the frequency divider 89 and oscillator 88.

The output of filters 91 to 100 are fed to contacts of a three bank multi-position switch 101. The three banks of the switch 101 are represented in the drawing by three contact arms 102, 103, and 104, and a single set of contacts only.

The contact arm 102 is connected to an output terminal 105, to provide a first output oscillation. The contact arm 103 is connected to a frequency divider 106, in which an output oscillation is produced whose frequency is one tenth of the frequency of the harmonic selected according to the position of the contact arm 103. The output of the frequency divider 106 is fed to an output terminal 107 to provide a second output oscillation. The contact arm 104 is connected to the input of one of two frequency dividers 108 and 109 connected in cascade.

In each of the frequency dividers 108 and 109, an oscillation is produced whose frequency is one tenth of the frequency of the oscillation applied to its input. The output of the frequency divider 109 is fed to output terminal 110 to provide a third output oscillation, which is one hundredth of the frequency of the harmonic selected according to the position of the contact arm 104.

Using 100 kc./s. harmonics in the frequency range 11.0 mc./s. to 11.9 mc./s. and the filters 91 to 100 each tuned to pass a different one of the 100 kc/s. harmonics, the output oscillations from terminals 105, 107 and 110 may be combined to obtain an output oscillation which is variable in frequency in 1 kc./s. steps in the range 12.21 mc./s. to 13.209 mc./s.

In the embodiments described, the frequency steps of at least two of the separate oscillations have a 10:1 relationship between them. The frequency dividers each provide an output oscillation whose frequency is one tenth of the frequency of the harmonic fed to its input.

Frequency dividers providing an input/output relationship less or greater than 10:1 may be used if desired. For example, filters designed to pass the 42nd, 44th, 46th and 48th harmonics of a 100 kc./s. fundamental frequency may be used in conjunction with a frequency divider having a 4:1 input/output frequency relationship, to provide an oscillation, variable in frequency in 50 kc./s. steps between 5.25 mc./s. and 6 mc./s. when the separate oscillations are combined.

What I claim is:

1. Apparatus for providing at least two frequency stabilized oscillations comprising a single stable frequency source of oscillation, harmonics of said stable frequency, ten electric wave filters each of which are fed from the said single source and each of which are adapted to pass a different harmonic oscillation, said oscillations being related by a common frequency difference, switching means connected to said filters for selecting at least two of the said harmonic oscillations passed by the electric wave filters, said switching means comprising a first switch having a first ten-position bank and a second ten-position bank and a second switch having a first ten-position bank and a second ten-position bank, a first output terminal connected to said second switch and a second output terminal connected to said first switch, a decade frequency divider connected between the second switch and the first output terminal, the first switch including means for selecting one harmonic from its first bank and one harmonic from its second bank and supplying said harmonics to the second bank of the second switch, the said two selected harmonic oscillations being related to each other by said common frequency difference, the second bank of the second switch selectively supplying to the first output terminal one or the other of said two selected harmonic oscillations and the first bank of the second switch supplying to the second output terminal a selected one of the harmonic oscillations by way of the said decade frequency divider.

2. Apparatus as claimed in claim 1, in which the said single source of oscillation harmonics of stable frequency includes a spectrum generator supplied from an oscillator of stable frequency.

3. Apparatus as claimed in claim 1, including a second frequency divider between the said oscillator and the spectrum generator.

4. Apparatus as claimed in claim 1, in which the harmonic oscillations passed by the electric wave filters are consecutive oscillation harmonics.

References Cited by the Examiner

UNITED STATES PATENTS

| | | | |
|---|---|---|---|
| 2,930,988 | 3/1960 | Boff | 331—38 |
| 2,957,144 | 10/1960 | Huhn | 331—40 |
| 3,202,930 | 8/1965 | Muraszko | 331—38 |

FOREIGN PATENTS

| | | |
|---|---|---|
| 665,924 | 2/1952 | Great Britain. |

ROY LAKE, *Primary Examiner.*

JOHN KOMINSKI, *Assistant Examiner.*